(12) United States Patent
Malladi et al.

(10) Patent No.: US 10,784,862 B1
(45) Date of Patent: Sep. 22, 2020

(54) HIGH SPEED SWITCHING RADIO FREQUENCY SWITCHES

(71) Applicant: NXP USA, Inc., Austin, TX (US)

(72) Inventors: Venkata Naga Koushik Malladi, Tempe, AZ (US); Joseph Staudinger, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/566,710

(22) Filed: Sep. 10, 2019

(51) Int. Cl.
*H03K 17/693* (2006.01)
*H03F 3/217* (2006.01)
*H04B 1/16* (2006.01)
*H03F 3/19* (2006.01)
*H03F 3/45* (2006.01)
*H03K 17/0416* (2006.01)
*H03K 17/16* (2006.01)

(52) U.S. Cl.
CPC ............. *H03K 17/693* (2013.01); *H03F 3/19* (2013.01); *H03F 3/2171* (2013.01); *H03F 3/45995* (2013.01); *H03K 17/04163* (2013.01); *H03K 17/162* (2013.01); *H04B 1/16* (2013.01); *H03F 2200/451* (2013.01); *H03K 2217/0018* (2013.01)

(58) Field of Classification Search
CPC ............... H03K 17/162; H03K 17/687; H03K 17/6872; H03K 17/693; H03K 17/04163; H03F 3/19; H03F 3/2171; H03F 3/45995; H04B 1/16
See application file for complete search history.

(56) References Cited

U.S. PATENT DOCUMENTS

| | | |
|---|---|---|
| 5,808,322 A | 9/1998 | Nicholson et al. |
| 7,161,197 B2 | 1/2007 | Nakatsuka et al. |
| 7,504,677 B2 | 3/2009 | Glass et al. |
| 7,532,094 B2 | 5/2009 | Arnold |
| 8,008,988 B1 | 8/2011 | Yang et al. |
| 8,174,050 B2 | 5/2012 | Boles et al. |
| 8,536,636 B2 | 9/2013 | Englekirk |
| 8,723,260 B1 | 5/2014 | Carroll et al. |
| 8,824,974 B2 | 9/2014 | Nakajima et al. |
| 9,438,223 B2 | 9/2016 | De Jongh |
| 9,484,973 B1 | 11/2016 | Carroll et al. |

(Continued)

FOREIGN PATENT DOCUMENTS

WO 2016/0205553 A1 2/2016

OTHER PUBLICATIONS

Keysight U9397A/C, technical document, http://literature.cdn.keysight.com/litweb/pdf/5989-6088EN.pdf.

(Continued)

*Primary Examiner* — John W Poos
(74) *Attorney, Agent, or Firm* — Sherry W. Schumm

(57) ABSTRACT

Embodiments described herein include radio frequency (RF) switches. In general, the embodiments described herein selectively bias the output terminals of one or more switching transistors in the RF switch. Such coupling can provide a bias that significantly reduces the effects of gate-lag. In one embodiment, the RF switch includes an antenna node, a first input/output (I/O) node, a second I/O node, a field-effect transistor (FET), a FET stack, and a bias coupling circuit. In this embodiment the bias coupling circuit electrically couples a gate terminal of the FET to one or more FET output terminals of the FET stack to provide a bias voltage to the output terminal(s).

20 Claims, 10 Drawing Sheets

(56) References Cited

U.S. PATENT DOCUMENTS

| | | | |
|---|---|---|---|
| 9,595,951 | B2 | 3/2017 | Sprinkle et al. |
| 9,780,090 | B2 | 10/2017 | Fraser et al. |
| 10,326,018 | B1 | 6/2019 | Malladi |
| 10,326,440 | B1 | 6/2019 | Malladi |
| 2005/0263799 | A1 | 12/2005 | Nakatsuka et al. |
| 2006/0214238 | A1* | 9/2006 | Glass ............... H01L 23/4824 257/401 |
| 2006/0217078 | A1 | 9/2006 | Glass et al. |
| 2006/0261912 | A1 | 11/2006 | Miyagi et al. |
| 2006/0270367 | A1 | 11/2006 | Burgener et al. |
| 2007/0102730 | A1 | 1/2007 | Pailthorp |
| 2011/0001543 | A1 | 1/2011 | Kondo et al. |
| 2012/0001230 | A1 | 1/2012 | Takatani |
| 2012/0112832 | A1 | 5/2012 | Kawano et al. |
| 2014/0183609 | A1 | 7/2014 | Takatani et al. |
| 2015/0318852 | A1* | 11/2015 | Hoogzaad ............ H03K 17/687 327/434 |
| 2015/0341026 | A1 | 11/2015 | de Jongh |
| 2016/0329874 | A1 | 11/2016 | Mohammadpour et al. |
| 2016/0373106 | A1 | 12/2016 | Shah et al. |
| 2017/0317082 | A1 | 11/2017 | Den Hartog et al. |
| 2018/0012962 | A1 | 1/2018 | Yeh et al. |
| 2018/0197881 | A1 | 7/2018 | Scott et al. |
| 2019/0267489 | A1 | 8/2019 | Malladi |
| 2019/0267987 | A1 | 8/2019 | Malladi |

OTHER PUBLICATIONS

Val Peterson, 7—Instrumentation, Gallium Arsenide IC Applications Handbook, pp. 225-254, ISBN 9780122577352.

A. Armstrong; H. Wagner, "A 5-V/sub p-p/ 100-ps GaAs pulse amplifier IC with improved pulse fidelity," in IEEE Journal of Solid-State Circuits, vol. 27, No. 10, pp. 1476-1481, Oct. 1992.

Non-Final Office Action dated Oct. 24, 2018 for U.S. Appl. No. 15/907,740 6 pages.

Notice of Allowance; U.S. Appl. No. 15/907,740; 10 pages (dated Apr. 18, 2019).

Non-Final Office Action dated Oct. 24, 2018 for U.S. Appl. No. 15/908,009 7 pages.

Notice of Allowance; U.S. Appl. No. 15/908,009; 10 pages (dated Apr. 17, 2019).

Notice of Allowance; U.S. Appl. No. 16/398,811; 9 pages (dated Dec. 16, 2019).

U.S. Appl. No. 16/701,927; not yet published; 42 pages (Dec. 3, 2019).

Hsu, H. et al. "Improved GaAs PHEMT T/R Switches Performance with Multi-Gate/Islands Configuration", ResearchGate, 4 pgs. (Jan. 1, 2014).

Koya, S. et al. "Intergate-Channel-Connected Multi-Gate PHEMT Devices for Antenna Switch Applications", IEEE MTT-S International Microwave Symposium Digest, pp. 1287-1290 (Jun. 2008).

Keysight U9397A/C, technical document, http://literature.cdn.keysight.com/litweb/pdf/5989-6088EN.pdf., retrieved on Sep. 10, 2019.

Val Peterson, 7—Instrumentation, Gallium Arsenide IC Applications Handbook, pp. 225-254, ISBN 9780122577352, copyright 1995 by Academic Press, Inc.

Notice of Allowance; U.S. Appl. No. 16/398,992; 9 pages (dated Jan. 17, 2020).

Non Final Office Action; U.S. Appl. No. 16/701,927; 9 pages dated Jun. 10, 2020.

* cited by examiner

HIGH SPEED SWITCHING RADIO FREQUENCY SWITCHES

TECHNICAL FIELD

Embodiments of the subject matter described herein relate generally to radio frequency (RF) switches and specifically RF switches for high speed switching and high power handling.

BACKGROUND

Radio frequency (RF) switches are used extensively in various RF applications, including RF power amplification, RF signal transmission, and RF signal reception. In various applications these RF switches need to provide both high speed switching and high power handling. To facilitate high power handling many RF switches use one or more stacks of field effect transistors (FETs), where each stack includes a series-coupled arrangement of several FETs. In such devices each FET can be a monolithic transistor device that includes a variable-conductivity channel between drain and source terminals, along with one or more gates positioned over the channel. Electrical signals provided to the gates control the conductivity of the channel during operation of the FETs. RF switches implemented with such stacks of FETs can thus provide relatively higher power handling capability.

However, one issue with such RF switches is the ability to provide increasing switching speeds while still providing high power handling capability. For example, the switching speed of some RF switches can be speed limited by a "gate-lag" phenomenon found in some FETs, where such gate-lag can result in "slow tail" switching. In general, the gate-lag phenomenon is a delay in drain current caused by trapping of electrons under the gate of the transistor. For example, in some FETs formed of type III-V materials (e.g., gallium arsenide (GaAs) and gallium nitride (GaN) FETs), undesirable surface traps may result in significant gate-lag. This gate-lag can result in slow steady state settling that reduces the high speed switching capability of the RF switch. Thus, there remains a continuing need for improved RF switches that can provide both high power handling and high speed switching.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein include radio frequency (RF) switches that may provide increased switching speed while also maintaining high power capability. In general, the embodiments described herein can provide this increased switching speed by selectively biasing the output terminals of one or more switching transistors in the RF switch. In one embodiment, this selective biasing of the output terminals is provided by coupling the gate terminals of one transistor stack to the output terminals of another transistor stack. Such coupling of the gate terminals to the output terminals can provide biasing that significantly reduces the effects of gate-lag while not significantly reducing the power handling capability of the transistor stack.

In one embodiment, the RF switch includes an antenna node, a first input/output (I/O) node, a second I/O node, a first field-effect transistor (FET) stack, a second FET stack, and a first bias coupling circuit. In this embodiment the first FET stack includes a first gate terminal and a first plurality of output terminals (e.g., a first plurality of source/drain terminals). The second FET stack likewise includes a second gate terminal and a second plurality of output terminals. The first bias coupling circuit electrically couples the first gate terminal to the second plurality of output terminals (e.g., a second plurality of source/drain terminals). As such, the first bias coupling circuit provides a bias voltage to the source/drains of the transistors in the second FET stack, and that bias can significantly reduce the effects of gate-lag in the second FET stack.

Figure 1:
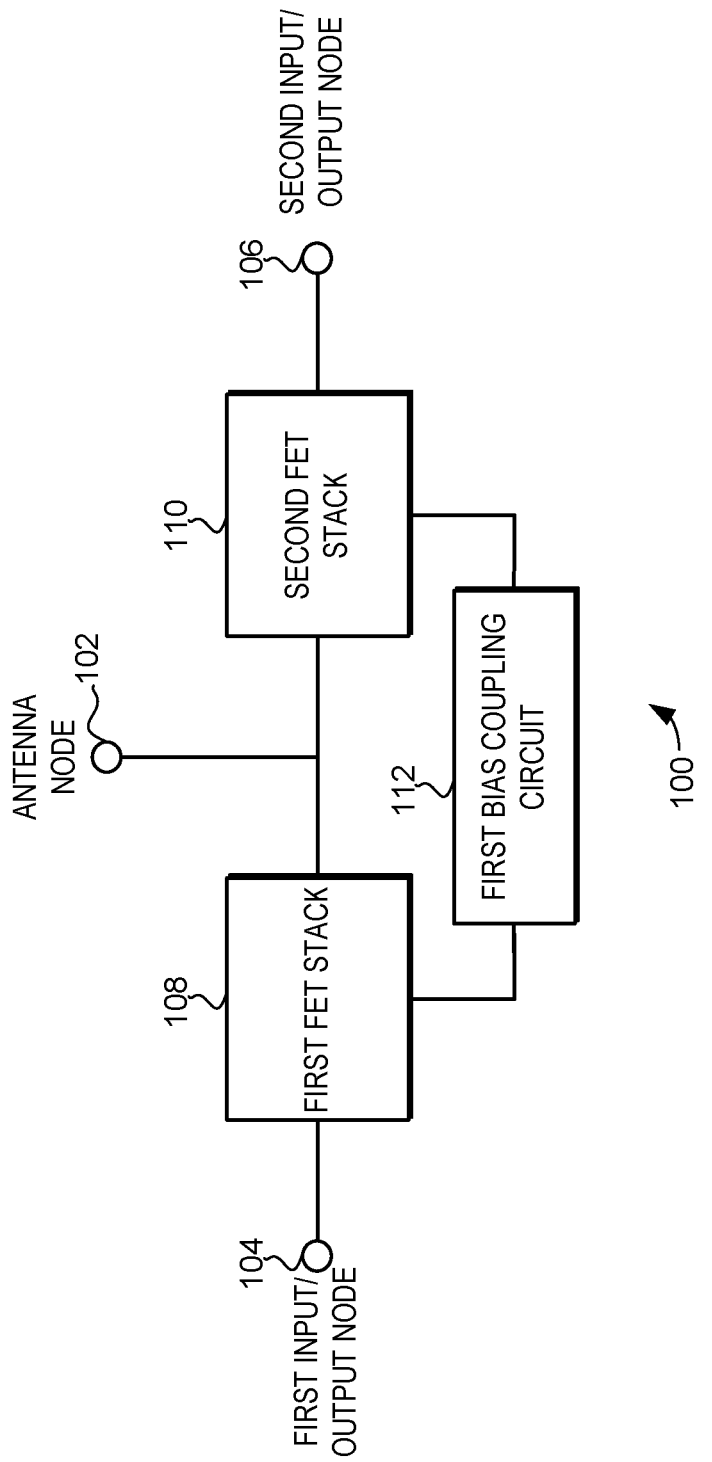
FIG. 1 is a schematic diagram of a radio frequency (RF) switch in accordance with an exemplary embodiment.

Turning now to FIG. 1, a schematic view of an RF switch 100 in accordance with an embodiment is illustrated. The RF switch 100 includes an antenna node 102, a first input/output (I/O) node 104, a second I/O node 106, a first field-effect transistor (FET) stack 108, a second FET stack 110, and a first bias coupling circuit 112. In general, the first bias coupling circuit 112 is configured to selectively bias one or more output terminals of one or more switching transistors in the second FET stack 110. Specifically, the first bias coupling circuit 112 couples one or more gate terminals in the first FET stack 108 to one or more output terminals of the second FET stack 110. Such coupling of the gate terminals in the first FET stack 108 to the output terminals of the second FET stack 110 can provide a bias voltage to the transistors of the second FET stack 110 that may significantly reduce the effects of gate-lag while not significantly reducing the power handling capability of the transistor stack.

Specifically, the coupling of the gate terminal(s) in the first FET stack 108 to the output terminal(s) of the second FET stack 110 can provide a temporary forward bias voltage to one or more of the transistors of the second FET stack 110 when that FET stack is turned on and conducting. This temporary forward bias of the transistor(s) in the second FET stack 110 causes those transistor(s) to turn on faster and thus can significantly reduce the problem of gate lag. Furthermore, because that temporary forward bias is only applied when the transistors of the second FET stack 110 are turned on, the power shut-off ability of the transistors in the second FET stack 110 is not significantly reduced.

In one specific example, the first FET stack 108 includes a first gate terminal and a first plurality of output terminals. The second FET stack 110 can likewise include a second gate terminal and a second plurality of output terminals. The first bias coupling circuit 112 electrically couples the first gate terminal to one or more of the second plurality of output terminals. As such, the first bias coupling circuit 112 can provide a bias voltage to the source/drains of the transistor(s) in the second FET stack 110, and that bias can significantly reduce the effects of gate-lag in the second FET stack 110.

In other embodiments the RF switch can include additional FET stacks and additional bias coupling circuits. For example, in one embodiment the RF switch 100 can additionally include a third FET stack, a fourth FET stack, and a second biasing coupling circuit. In such an embodiment the second bias coupling circuit can be configured to selectively bias one or more of the output terminals of one or more switching transistors in the third FET stack 110. Specifically, the second bias coupling circuit can couple one or more gate terminals in the first FET stack 108 to one or more output terminals of the third FET stack. Such coupling of the gate terminal(s) in the first FET stack 108 to the output terminal(s) of the third FET stack again can provide a bias voltage to the transistor(s) of the third FET stack that significantly reduces the effects of gate-lag while not significantly reducing the power handling capability of the transistor stack.

In some embodiments the first bias coupling circuit 112 can include a plurality of resistors, where each of the plurality of resistors is electrically coupled to one of the second plurality of output terminals. Likewise, the second bias coupling circuit can include a second plurality of resistors, where each of the second plurality of resistors is electrically coupled to one of the third plurality of output terminals.

Figure 2:
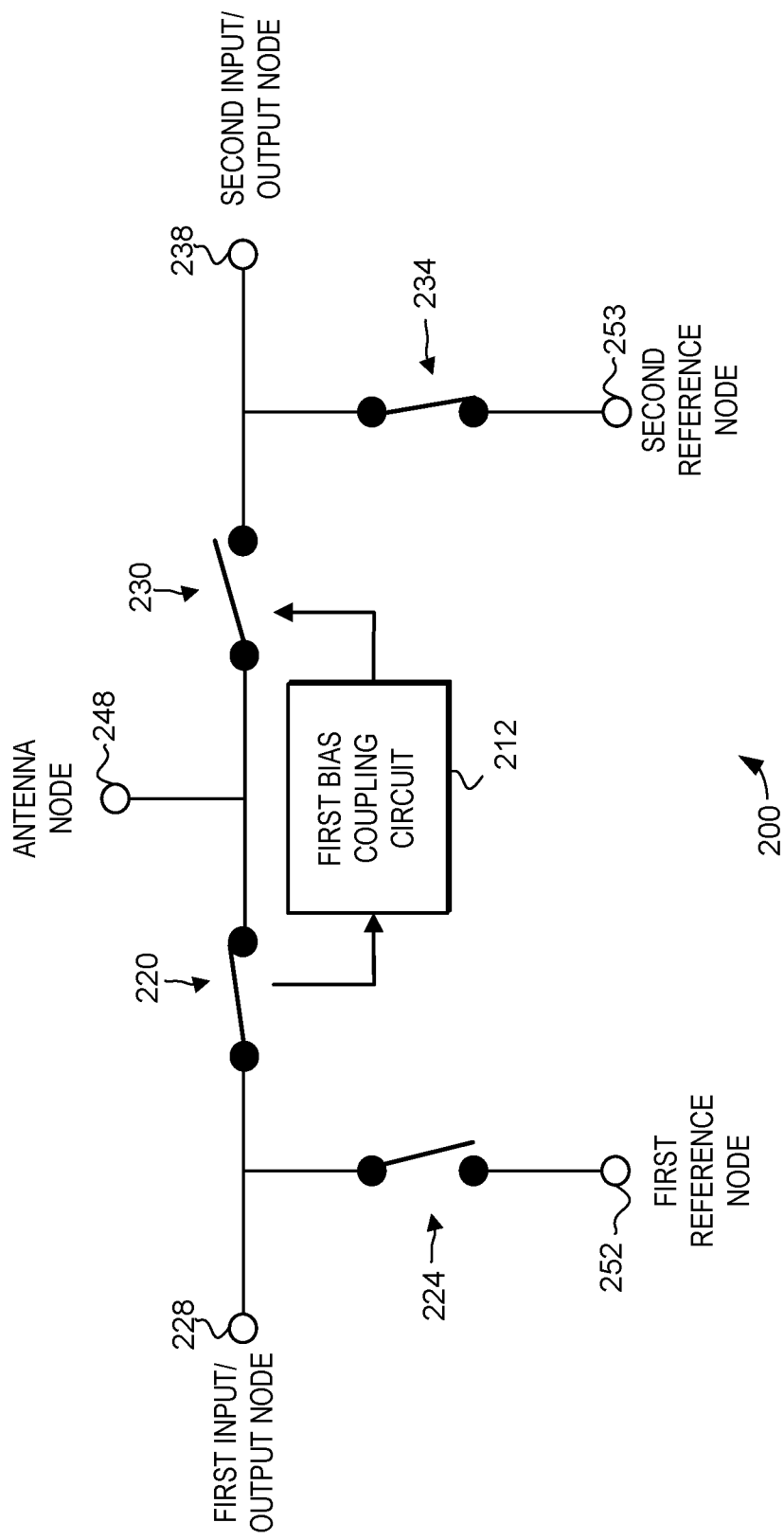
FIG. 2 is a circuit diagram of an RF switch in accordance with an exemplary embodiment.

Turning to FIG. 2, a simplified circuit diagram of an RF switch 200 in accordance with an exemplary embodiment is illustrated. The RF switch 200 includes a plurality of input/output (I/O) nodes, including first I/O node 228 and second I/O node 238. The RF switch 200 further includes an antenna node 248, a first reference node 252 and a second reference node 253. RF switch 200 further includes a plurality of switches 220, 224, 230, 234 electrically coupled between the various nodes 228, 238, 248, 252, 253. As will be described in greater detail below, one or more of the switches 220, 224, 230, 234 may be implemented as a stack of FETs.

In accordance with the embodiments described herein, the RF switch 200 includes at least a first bias coupling circuit 212 that is configured to selectively bias the output terminals of one or more switching transistors in the switch 230. Specifically, this first bias coupling circuit 212 couples one or more gate terminals in a switch 220 to one or more output terminals in the switch 230. Again, such a coupling of the gate terminals in switch 220 to the output terminals of the switch 230 can provide a bias voltage to the transistors of the switch 230 that significantly reduces the effects of gate-lag. Specifically, the coupling of the gate terminals in switch 220 to the output terminals of the switch 230 can provide a temporary forward bias voltage to the transistors of the switch 230 that that causes those transistors to turn on faster and thus can significantly reduce the problem of gate-lag. Furthermore, because this temporary forward bias is only applied when the transistors of the second switch 230 are turned on, the power shut-off ability of the switch 230 is maintained.

Furthermore, as will be described in greater detail below additional biasing coupling circuits can be provided to other switches in the RF switch 200. For example, a second bias coupling switch can be used to provide a similar temporary forward bias voltage to one or more of the transistors of switch 224 that causes those transistors to again turn on faster and reduce the problem of gate lag. And again, because that that temporary bias is only applied when the switch 224 is turned on the power shut-off ability of the switch 224 is maintained.

Figure 3:
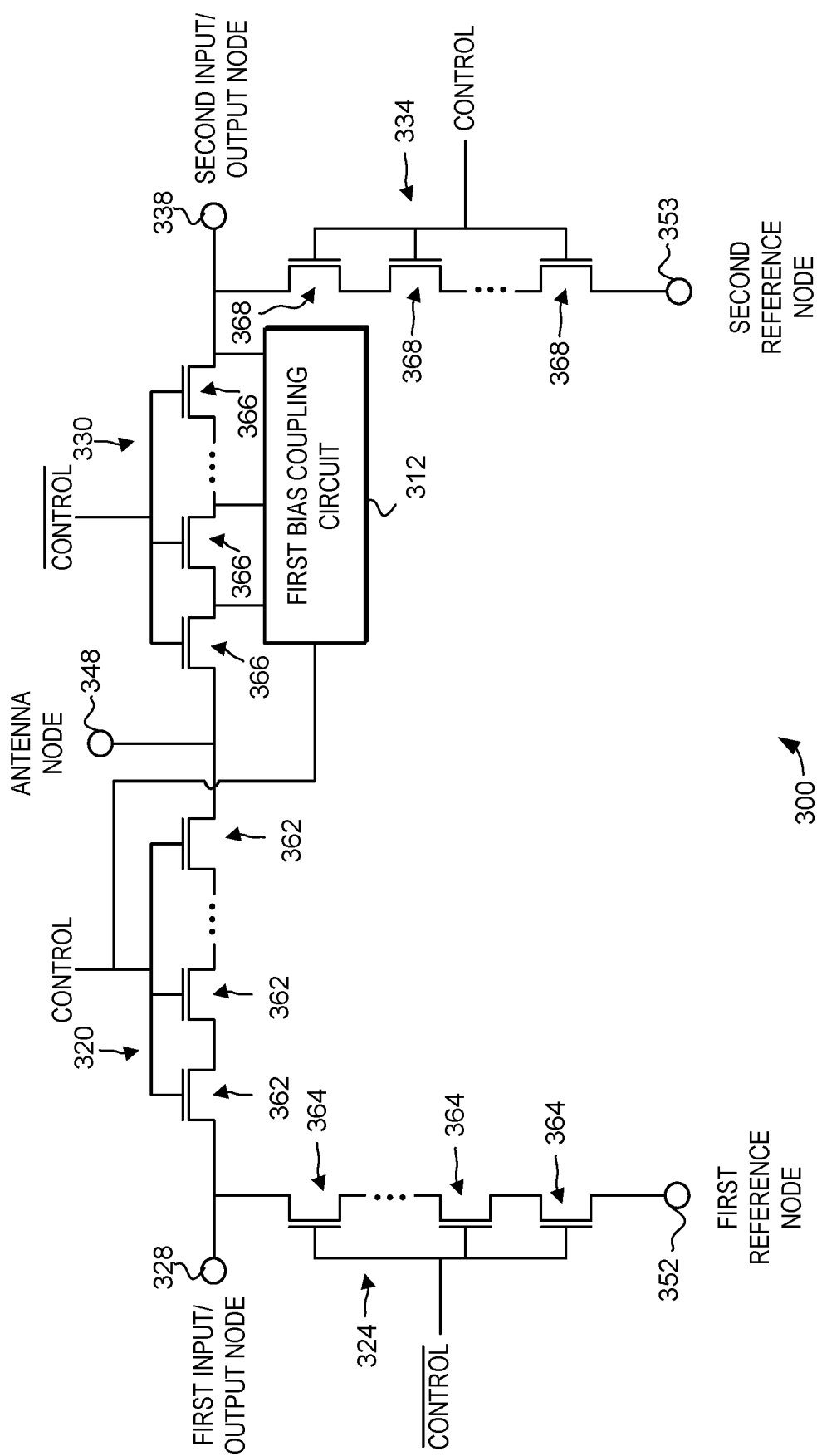
FIG. 3 is a circuit diagram of an RF switch in accordance with an exemplary embodiment.

Turning to FIG. 3, a more detailed circuit diagram of an RF switch 300 in accordance with an exemplary embodiment is illustrated. In this illustrated example, the RF switch 300 again includes a plurality of input/output nodes, including first I/O node 328 (e.g., a transmit node) and second I/O node 338 (e.g., a receive node). The RF switch 300 further includes an antenna node 348, a first reference node 352 and a second reference node 353. The RF switch 300 further includes a plurality of switches 320, 324, 330, 334 electrically coupled between the various nodes 328, 338, 348, 352, 353. In this illustrated embodiment each of the switches 320, 324, 330, 334 are implemented as a stack of FETs.

Specifically, switch 330 is implemented as a first stack of series-coupled FETs 366 that are electrically coupled between the antenna node 348 and the I/O node 338. Likewise, switch 320 is implemented as a second stack of series-coupled FETs 362 that are electrically coupled between the I/O node 328 and antenna node 348. Switch 324 is likewise implemented as a third stack of series-coupled FETs 364 that are electrically coupled between the I/O node 328 and first reference node 352. Finally, switch 334 is likewise implemented as a fourth stack of series-coupled FETs 368 that are electrically coupled between the I/O node 338 and second reference node 353. It should be noted that while the first reference node 352 and the second reference node 353 would typically be coupled to a ground reference (e.g., zero volts), the nodes could alternatively be coupled to a positive or negative DC voltage reference.

As used herein, the term "series-coupled," in reference to the electrical coupling between multiple FETs in a stack, means that the output terminals (e.g., source/drain terminals) of the multiple FETs are connected together to provide a continuous electrically conductive channel/path between an input node (e.g., I/O node 328) and an output node (e.g., antenna node 348) when the multiple FETs are in a conducting state (e.g., "on" or "closed"). For example, in a series-coupled sequence of FETs a source terminal for one FET may be coupled to the drain terminal of the adjacent FET.

In FIG. 3, each of the switches 320, 324, 330, 334 of FETs is shown to include three series-coupled FETs 362, 364, 366, 368. However, this is just one example implementation. In other embodiments each of the switches 320, 324, 330, 334 may alternatively include less than three FETs or more than three FETs (as indicated with the ellipses in each FET stack). Furthermore, each of the switches 320, 324, 330, 334 may include a same number of FETs or may instead include different numbers of FETs.

In this illustrated example each of the FETs 362, 364, 366, 368 includes a gate terminal (or control terminal), an input terminal (e.g., a drain/source terminal), and an output terminal (e.g., a source/drain terminal). As typical with FETs, the conductivity of the channel between source/drain terminals for each of the FETs 362, 364, 366, 368 may be controlled by the application of appropriate voltages to the corresponding gate terminal.

To facilitate operation, the RF switch 300 is controlled using a control signal (CONTROL) and an inverse control signal ($\overline{CONTROL}$). Specifically, the control signal is used to control switches 320 and 334 and the inverse control signal is used to control switches 324 and 330. To facilitate this, the control signal is applied to the gate terminals of the FETs 362 and 368, and the inverse control signal is applied to the gate terminals of FETs 364 and 366. Typically, the control signals and inverse control signals provided to each gate in any particular switch 320, 324, 330, 334 are synchronous, in that they simultaneously cause all of the FETs in that stack either to be substantially conducting (e.g., "on" or "closed") or substantially non-conducting (e.g., "off" or "open"). However, it should be noted that in other embodiments the control signals and inverse control signals may be asynchronous.

During typical operation the RF switch 300 is operated to alternate between coupling an RF transmit signal provided by a transmitter (not shown) coupled to I/O node 328 to the antenna node 348 and coupling an RF receive signal provided by the antenna at antenna node 348 to a receiver (not shown) coupled to I/O node 338. Specifically, in the transmit state, switches 320 and 334 are closed, and switches 324 and 330 are open. Specifically, in the transmit state the control signal applied to the gate terminals of FETs 362 and 368 causes those FETs to be in a substantially conducting state, while the inverse control signal applied to the gate terminals of FETs 364 and 366 causes those FETs to be in a substantially non-conducting state. Accordingly, in the transmit state, signal energy present at I/O node 328 is conveyed through switches 320 to antenna node 348, and the conductive path between I/O node 328 and reference node 352 is open. In addition, in the transmit state, signal energy present at I/O node 338 is conveyed through switches 334 to reference node 353, and the conductive path between I/O node 338 and antenna node 348 is open.

Conversely, in the receive state, switches 330 and 324 are closed, and switches 320 and 334 are open. Specifically, in the receive state the inverse control signal applied to the gate terminals of FETs 364 and 366 causes those FETs to be in a substantially conducting state, while the control signal applied to the gate terminals of FETs 362 and 368 causes those FETs to be in a substantially non-conducting state. Accordingly, in the receive state, signal energy present at antenna node 348 is conveyed through switches 330 to I/O node 338, and the conductive path between I/O node 338 and ground reference node 353 is open. In addition, in the receive state, signal energy present at I/O node 328 is conveyed through switches 324 to ground reference node 352, and the conductive path between I/O node 328 and the antenna node 348 is open.

The RF switch 300 can be implemented in variety of devices and structures. For example, in one embodiment the RF switch 300 is monolithic with FETs 362, 364, 366, and 368 formed in and on a single integrated circuit substrate (e.g., on a single semiconductor die). For example, according to an embodiment, the RF switch IC 300 may be formed on a gallium arsenide (GaAs)-based substrate. In other embodiments other substrates may be used including silicon (Si)-based substrates (e.g., bulk Si, silicon-on insulator (SoI), and so on) and gallium nitride (GaN)-based substrates (e.g., GaN on silicon, GaN on silicon carbide (SiC), and so on).

To implement switches 320, 324, 330, and 334 a variety of different types of FETs can be used. For example, one or more of the FETs 362, 364, 366, and 368 may be implemented with multi-gate FETs, although some of the FETs may be single-gate FETs, as well. Furthermore, in one embodiment the one or more of the FETs 362, 364, 366, and 368 may be implemented with pseudomorphic high electron mobility transistors (pHEMTs). In other embodiments one or more of the FETs 362, 364, 366, and 368 may be implemented in a variety of differently configured, gate-controlled, three-terminal components or transistors, including differently-configured pHEMTs, metal oxide semiconductor FETs (MOSFETs), high electron mobility transistors (HEMTs), metal-semiconductor field effect transistors (MESFETs), laterally diffused metal-oxide semiconductor (LDMOS) FETs, Enhancement-mode MOSFETs (EMOSFETs), and junction gate FETs (JFETs), to name a few.

As noted above, one continuing issue with the implementation of RF switches is the need to provide high switching speeds. Specifically, in some RF switches the switching speed may be limited by a "gate-lag" in the transistors of one or more the FET stacks (e.g., in FETs 362, 364, 366 and/or 368). For example, in some FETs formed of type III-V materials (e.g., GaAs and GaN FETs), undesirable surface traps may result in significant gate-lag. This gate lag can result in slow steady state settling sometimes referred to as a "slow tail" that that reduces the high speed switching capability of the RF switch.

To overcome this, the RF switch 300 includes at least a first bias coupling circuit 312 that is configured to selectively bias one or more of the output terminals (e.g., source/drain terminals) of one or more FETs 366 in the switch 330. Specifically, the first bias coupling circuit 312 couples a gate terminal of one or more FETs 362 in switch 320 to one or more of the source/drain terminals of FETs 366 in switch 330. Such a coupling of a gate terminal in switch 320 to the output terminals of FETs 366 provides a bias voltage to FETs 366 that can significantly reduce the effects of gate-lag and increase switching speed.

Specifically, the coupling of a gate terminal in switch 320 to one or more of the output terminals of FETs 366 provides a temporary strong forward bias voltage to FETs 366 when FETs 366 are turned on and conducting. This strong forward bias of the FETs 366 reduces the "slow-tail" phenomenon caused by gate-lag and causes the FETs 366 to turn on faster than they would without this additional bias. Furthermore, because that strong forward bias is only applied when the FETs 366 are turned on, the power shut-off ability of the FETs 366 is not significantly reduced when the FETs 366 are turned off. This maintains the power handling capability of the FETs 366 and thus facilitates high power switching.

Specifically, in RF switch 300 the coupling of the gate terminal of one or more FETs 362 in switch 320 to the output terminals of FETs 366 in switch 330 effectively provides the control signal to output terminals of FETs 366 at the same time the control signal is being applied to the gate terminal of FETs 362. And because the inverse control signal is applied to the gate terminals of FETs 366 the gate voltage relative to the output terminal (e.g., the gate-source voltage, $V_{GS}$) for FETs 366 is greatly increased while the FETs 366 are turned on and conducting. Thus, a strong forward bias is applied to the FETs 366 when those transistors are turned on.

Although the embodiment of FIG. 3 shows the first bias coupling circuit 312 being connected between one or more gate terminals in switch 320 to all of the output terminals of FETs 366 in switch 330, in alternate embodiments, the first bias coupling circuit 312 may be connected to fewer than all of the output terminals of FETs 366 in switch 330. In one example, the first bias coupling circuit 312 may be connected between one or more gate terminals in switch 320 and as few as one of the output terminals of FETs 366 in switch 330. In embodiments in which the first bias coupling circuit 312 is connected to fewer than all of the output terminals of FETs 366, it may be desirable to connect the first bias coupling circuit 312 to one or more FETs 366 that are closest to the antenna node 348 to facilitate fast turn on of those upstream FET(s) 366.

As one non-limiting example, the FETs 366 can be implemented as N-channel devices that are in an ON state with low resistance between source and drain terminals when $V_{GS}$ is greater than ~0.0 V and in an OFF state when $V_{GS}$ is −3.0 V or less. In such an embodiment the control signal can be a signal that alternates between applying 3.0 V and 0.0 V with the inverse control signal providing the inverse voltages. Of course, voltages other than 3.0 V and 0.0 V (or their inverses) alternatively may be implemented as the ON and OFF state voltages.

Figure 4:
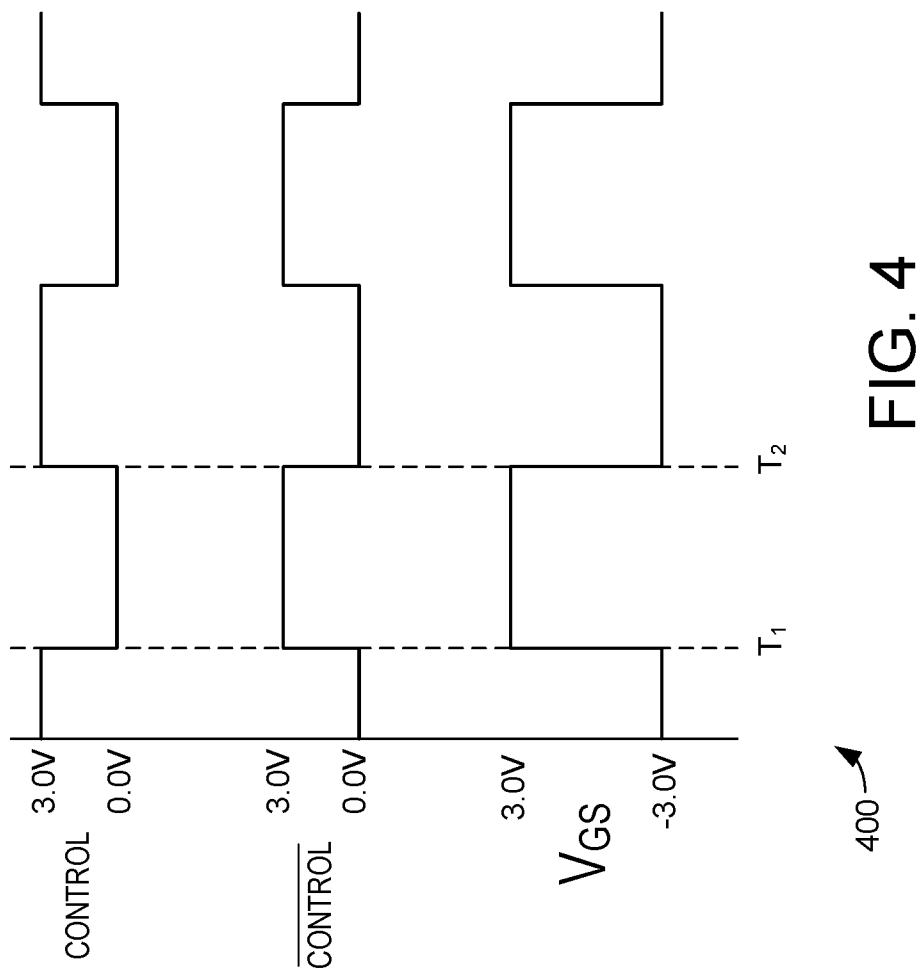
FIG. 4 is a graphical representation of signals in accordance with an exemplary embodiment.

Turning now to FIG. 4, a graph 400 illustrates an exemplary control signal (CONTROL) and an inverse control signal ($\overline{\text{CONTROL}}$) that alternate between 3.0 V and 0.0 V and the resulting $V_{GS}$ of FETs 366. Referring to FIGS. 3 and 4 together, such a control signal can be applied to the gate terminals of FETs 362 and 368 while the inverse control signal is applied to the gate terminals of FETs 364 and 366.

This results in the operation of the RF switch 300 as described above. In general, when the control signal is high (e.g., 3.0 V) and the inverse control signal is low (e.g., 0.0 V) the FETs 362 in switch 320 and the FETs 368 in switch 334 are on (i.e., closed) while the FETs 364 in switch 324 and the FETs 366 in switch 330 are off (i.e., open). Conversely, when the control signal is low (e.g., 0.0 V) and the inverse control signal is high (e.g., 3.0 V) the FETs 362 in switch 320 and the FETs 368 in switch 334 are off while the FETs 364 in switch 324 and the FETs 366 in switch 330 are on.

Furthermore, in accordance with the embodiments described herein, the control signal is additionally applied to the output terminals (e.g., drain or source terminals) of FETs 366. This results in the FETs 366 being strongly forward biased when turned on, thus reducing the effects of gate-lag. In FIG. 4 this occurs at time $T_1$ when the control signal transitions from high to low (e.g., 0.0 V) and the inverse control signal transitions from low to high (e.g., 3.0 V). In the example of FIGS. 3 and 4 this results in the FETs 366 of switch 330 having a gate-source voltage ($V_{GS}$) of approximately 3.0 V. Again, in this example the FETs 366 turn on with a $V_{GS}$ 0.0 V or greater (and again, it should be noted again that this is just one example, and that other FETs that can be used will turn on at other voltages, with GaAs and GaN FETs commonly implemented to turn on between −0.5 to 0.5V). Thus, by providing a $V_{GS}$ of approximately 3.0 V (significantly greater than the turn on voltage) the first bias coupling circuit 312 provides a strong forward bias to the FETs 366 that can significantly increase the switching speed of the FETs 366.

Then at time $T_2$, the control signal transitions from low to high (e.g., 3.0 V) and the inverse control signal transitions from high to low (e.g., 3.0 V). In the example of FIGS. 3 and 4 this results in the FETs 366 of switch 330 having a $V_{GS}$ of approximately −3.0 V. Again, in this example the FETs 366 turn off with a $V_{GS}$ of less than 0.0 V. Thus, by providing a $V_{GS}$ of −3.0V (significantly less than the turn off voltage) the FETs 366 are fully turned off for good power handling.

In summary, in the example of FIGS. 3 and 4 the first bias coupling circuit 312 provides strong forward bias voltage (i.e., a $V_{GS}$ of 3.0 V) to FETs 366 at the time that the FETs 366 are turned on while allowing for a strong reverse bias voltage (i.e., a $V_{GS}$ of −3.0 V) applied to FETs 366 at the time when the FETs 366 are turned off. Thus, the first bias coupling circuit 312 may reduce the effects of gate-lag and provide a fast switching speed when the FETs 366 are switched to a conducting state while ensuring the FETs 366 are fully reversed biased when the FETs 366 are turned off.

Figure 5A:
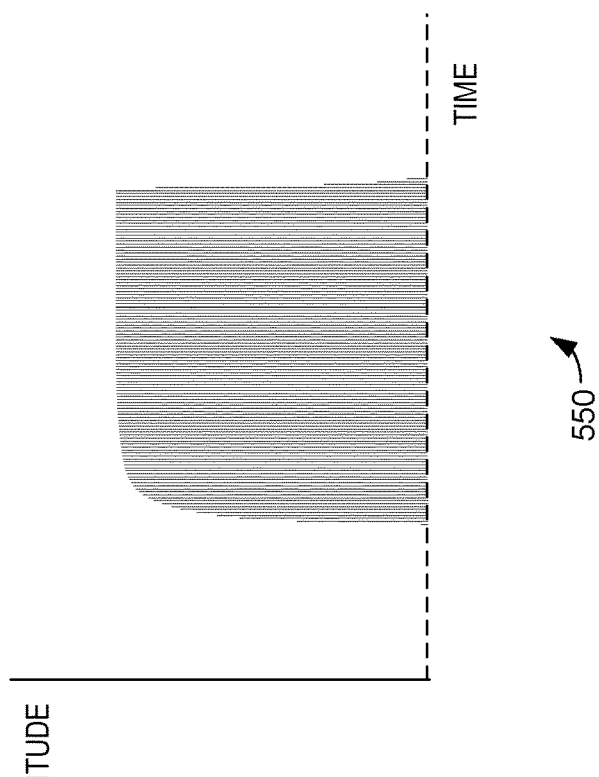
FIGS. 5A and 5B are graphical representations of RF signals in accordance with an exemplary embodiment.
Figure 5B:
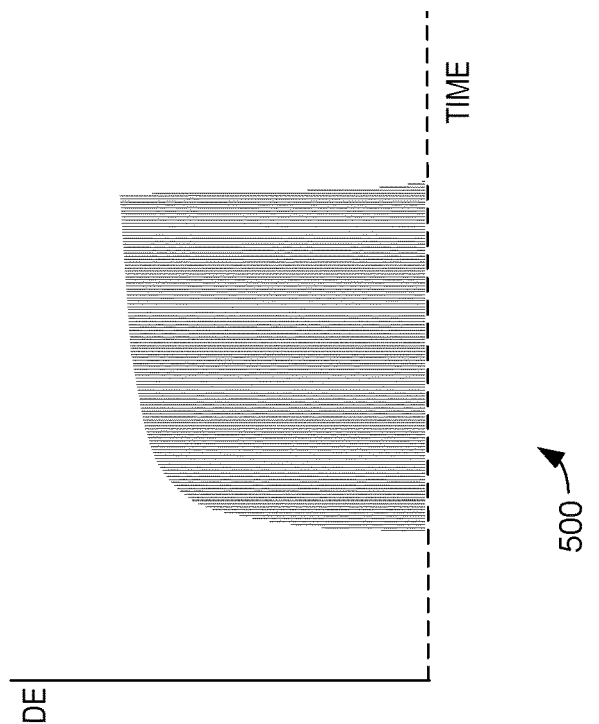

Turning now to FIGS. 5A and 5B, graphs 500 and 550 show exemplary RF signals as would be seen at an output node of an RF switch (e.g., RF switch 100, 200, 300). These RF signals are specifically amplitude modulated carrier signals that would be present at the output of the RF switch when the RF switch turns on and then off. These amplitude modulated carrier signals have a fundamental frequency ($f_0$). These amplitude modulated carrier signals are exemplary of the type of RF signals that can be generated by high frequency RF devices in many typical applications.

Graph 500 shows exemplary effects of gate-lag on the RF switch output. Specifically, the gate-lag results from slow tail switching on the initial turn on of the RF switch. This increases the final settling time and increases the time to the final steady state value. This slow tail and increased time to the final steady state value can limit the effective switching speed of the RF switch.

Graph 550 shows the exemplary effects of gate lag when a forward bias voltage is applied with a bias coupling circuit (e.g., bias coupling circuit 112, 212, 312), according to an embodiment. In graph 550 the resulting output of the RF switch shows significantly reduced "slow tail" and thus has a significantly reduced settling time and reaches final steady state value quicker. Again, this reduction in the slow tail and reduced time to final steady state value can increase the high speed switching capability of the RF switch.

Figure 6:
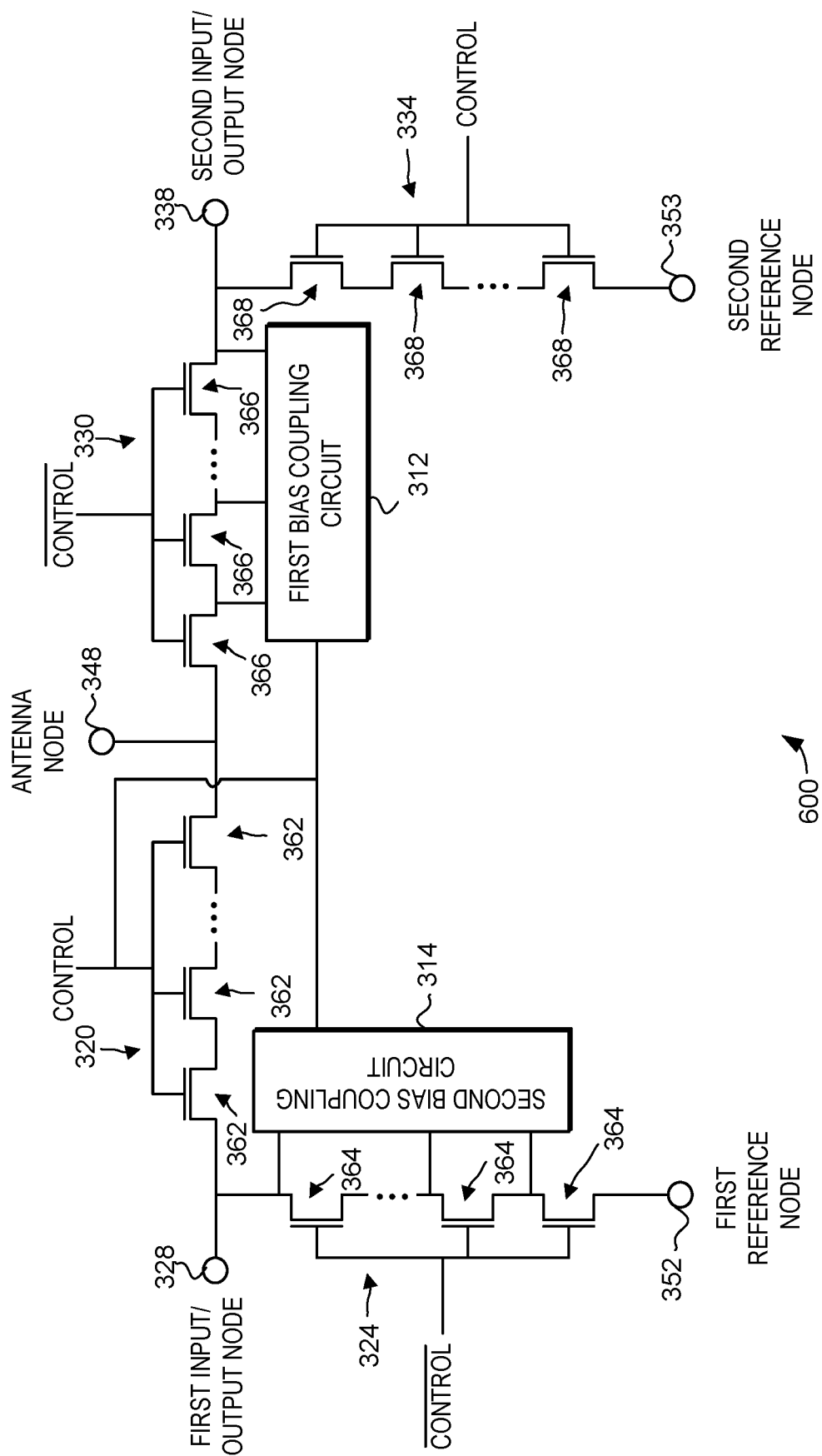
FIG. 6 is a circuit diagram of an RF switch in accordance with an exemplary embodiment.

Turning to FIG. 6, a circuit diagram of an RF switch 600 in accordance with another exemplary embodiment is illustrated. In this illustrated example, the RF switch 600 again includes a plurality of input/output nodes, including first I/O node 328 and second I/O node 338. The RF switch 300 further includes an antenna node 348, a first reference node 352 and a second reference node 353. The RF switch 300 further includes a plurality of switches 320, 324, 330, 334 electrically coupled between the various nodes 328, 338, 348, 352, 353. In this illustrated embodiment each of the switches 320, 324, 330, 334 are again implemented as a stack of FETs.

Specifically, switch 330 is implemented as a first stack of series-coupled FETs 366, switch 320 is implemented as a second stack of series-coupled FETs 362, switch 324 is implemented as a third stack of series-coupled FETs 364, and switch 334 is implemented as a fourth stack of series-coupled FETs 368.

In accordance with the embodiments described herein the RF switch 600 includes a first bias coupling circuit 312 and a second bias coupling circuit 314. Again, the first bias coupling circuit 312 is configured to selectively bias the output terminals of one or more FETs 366 in the switch 330. Specifically, the first bias coupling circuit 312 couples a gate terminal of one or more FETs 362 in switch 320 to one or more of the source/drain terminals of FETs 366 in switch 330. As described above, such a coupling of a gate terminal in switch 320 to the output terminal(s) of FETs 366 provides a temporary strong forward bias voltage to FETs 366 when FETs 366 are turned on and conducting. This strong forward bias of the FETs 366 reduces the "slow-tail" phenomenon caused by gate-lag and causes the FETs 366 to turn on faster than they would without this additional bias. Furthermore, because that strong forward bias is only applied when the FETs 366 are turned on, the power shut-off ability of the FETs 366 is not significantly reduced. This maintains the power handling capability of the FETs 366 and thus facilitates high power switching.

Likewise, in this illustrated embodiment the second bias coupling circuit 314 is added to selectively bias the output terminals of one or more FETs 364 in the switch 324. Specifically, the second bias coupling circuit 314 couples a gate terminal of one or more FETs 362 in switch 320 to one or more of the source/drain terminals of FETs 364 in switch 324. As described above, such a coupling of a gate terminal in switch 320 to the output terminal(s) of FETs 364 provides a temporary strong forward bias voltage to FETs 364 when FETs 364 are turned on and conducting. Again, this strong forward bias of the FETs 364 reduces the "slow-tail" phenomenon caused by gate-lag and causes the FETs 364 to turn on faster than they would without this additional bias. Furthermore, because that strong forward bias on applied when the FETs 364 are turned on, the power shut-off ability of the FETs 364 is not significantly reduced. This maintains the power handling capability of the FETs 364 and thus facilitates high power switching.

Specifically, in RF switch 600 the coupling of the gate terminal of one or more FETs 362 in switch 320 to one or more of the output terminals of FETs 364 in switch 324 effectively provides the control signal to output terminals of FETs 366 at the same time the control signal is being applied to the gate terminal of FETs 362. And because the inverse control signal is applied to the gate terminals of FETs 364 the gate voltage relative to the output terminal (e.g., $V_{GS}$) for FETs 364 is greatly increased while the FETs 364 are turned on and conducting. Thus, a strong forward bias is applied to the FETs 364 when those transistors are turned on. And again, this configuration allows for a strong reverse bias when the FETs 364 are turned off. Thus, the second bias coupling circuit 314 reduces the effects of gate-lag and provides a fast switching speed when the FETs 364 are switched to a conducting state while ensuring the FETs 364 are fully reversed biased when the FETs 364 are turned off.

Although the embodiment of FIG. 6 shows the first bias coupling circuit 312 being connected between one or more gate terminals in switch 320 to all of the output terminals of FETs 366 in switch 330, in alternate embodiments, the first bias coupling circuit 312 may be connected to fewer than all of the output terminals of FETs 366 in switch 330. In one example, the first bias coupling circuit 312 may be connected between one or more gate terminals in switch 320 and as few as one of the output terminals of FETs 366 in switch 330. In embodiments in which the first bias coupling circuit 312 is connected to fewer than all of the output terminals of FETs 366, it may be desirable to connect the first bias coupling circuit 312 to one or more FETs 366 that are closest to the antenna node 348 to facilitate fast turn on of those upstream FET(s) 366.

Similarly, although the embodiment of FIG. 6 shows the second bias coupling circuit 314 being connected between one or more gate terminals in switch 320 to all of the output terminals of FETs 364 in switch 324, in alternate embodiments, the second bias coupling circuit 314 may be connected to fewer than all of the output terminals of FETs 364 in switch 324. In one example, the second bias coupling circuit 314 may be connected between one or more gate terminals in switch 320 and as few as one of the output terminals of FETs 364 in switch 324. In embodiments in which the second bias coupling circuit 314 is connected to fewer than all of the output terminals of FETs 364, it may be desirable to connect the second bias coupling circuit 314 to one or more FETs 364 that are closest to the first input node 328 to facilitate fast turn on of those upstream FET(s) 364.

Figure 7:
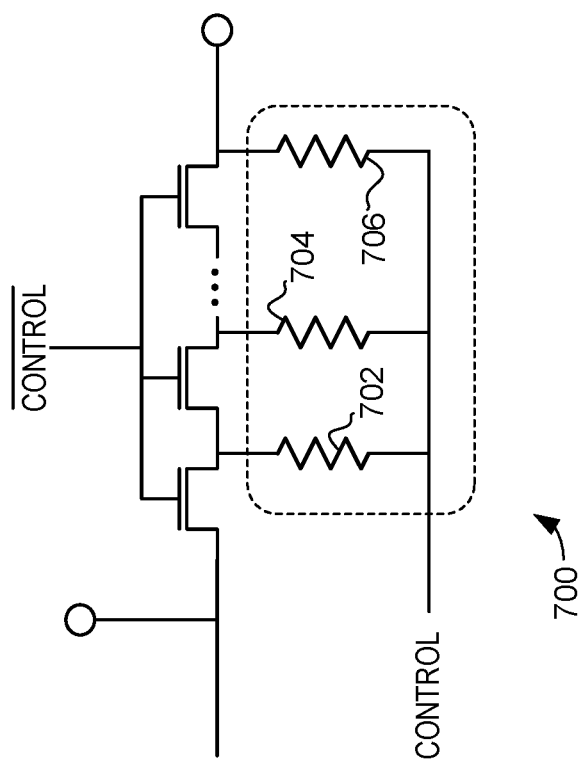
FIG. 7 is a circuit diagram of a bias coupling circuit in accordance with an exemplary embodiment.

Turning to FIG. 7, a detailed circuit diagram of a bias coupling circuit 700 in accordance with an exemplary embodiment is illustrated. The bias coupling circuit 700 is an example of the type of bias coupling circuit that can be used in the various RF switches described above (e.g., RF switches 100, 200, 300, 600). As such, the bias coupling circuit 700 could be used to implement the bias coupling circuits 112, 212, 312 and 314 to give several non-limiting examples. Again, the bias coupling circuit 700 is configured to couple a gate terminal of one or more FETs in one switch to the output terminals of the FETs in another switch. As described above, such a coupling of a gate terminal in a first switch to the output terminals of FETs in a second switch provides a strong forward bias voltage to the FETs in the second switch when those FETs are turned on and conducting.

In this example, the bias coupling circuit 700 includes a plurality of impedance elements individually coupled with the FET output terminals of the RF switch. Specifically, the bias coupling circuit includes resistors 702, 704 and 706, where each of the resistors is coupled to one output terminal on a corresponding FET in the RF switch. For example, each of the resistors 702, 704 and 706 can be coupled to a corresponding source terminal or drain terminal of a corresponding FET.

In general each of the resistors 702, 704 and 706 is provided to limit AC (e.g., RF) current flow by providing high impedance to signal energy at RF frequencies. Thus, the resistors 702, 704 and 706 ensure that the majority of AC current flow is through the FET stack and not back toward the gates of the other switch. As such, the resistors 702, 704 and 706 would typically be implemented with relatively large resistive elements. As one example, each of the resistors 702, 704 and 706 could have an impedance greater than 10K ohms. Of course, this is just one example and other configurations are possible. Furthermore, it should be noted that while the bias coupling circuit 700 includes resistors coupled between the gate terminal(s) of the FETs in the first switch and each output terminal of the FETs in the second switch, in other embodiments additional or different impedance elements could be used to provide high impedance at RF frequencies between the gate terminal(s) of the FETs in the first switch and the output terminals of the FETs in the second switch. For example, in other embodiments the bias coupling circuit 700 could include inductors or quarter wave transmission lines.

Figure 8:
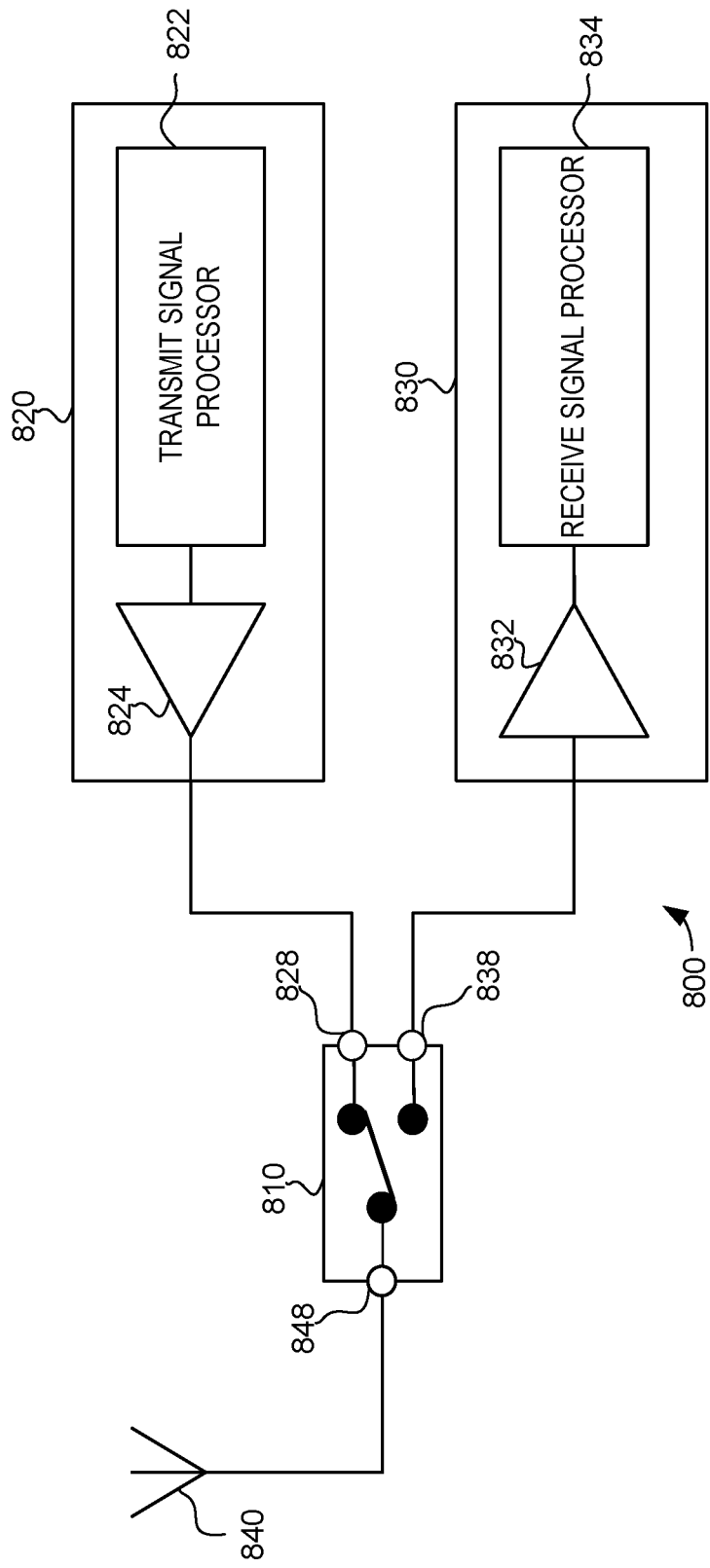
FIG. 8 is a simplified block diagram of an RF transceiver system.

Turning now to FIG. 8 a simplified block diagram of an example of a radio frequency (RF) transceiver system 800 is illustrated. The RF transceiver system includes an RF switch 810 (e.g., RF switch 100, 200, 300, 600, FIGS. 1-3, 6), a transmitter 820, a receiver 830, and an antenna 840. Transceiver system 800 is a half-duplex transceiver, in which only one of the transmitter 820 or the receiver 830 are coupled, through the RF switch 810, to the antenna 840 at any given time. More specifically, the state of the RF switch 810 is controlled with a control signal to alternate between coupling an RF transmit signal produced by the transmitter 820 to the antenna 840, or coupling an RF receive signal received by the antenna 840 to the receiver 830.

The transmitter 820 may include, for example, a transmit (TX) signal processor 822 and a power amplifier 824. The transmit signal processor 822 is configured to produce transmit signals, and to provide the transmit signals to the power amplifier 824. The power amplifier 824 amplifies the transmit signals, and provides the amplified transmit signals to the RF switch 810. The receiver 830 may include, for example, a receive amplifier 832 (e.g., a low noise amplifier) and a receive (RX) signal processor 834. The receive amplifier 832 is configured to amplify relatively low power received signals from the RF switch 810, and to provide the amplified received signals to the receive signal processor 834. The receive signal processor 834 is configured to consume or process the receive signals.

During each transmit time interval, the RF switch 810 is controlled to be in a first or "transmit" state, as depicted in FIG. 8, in which a transmit signal path is closed between transmitter node 828 and antenna node 848, and in which a receive signal path is open between antenna node 848 and receiver node 838. Conversely, during each receive time interval, the RF switch 810 is controlled to be in a second or "receive" state, in which the receive signal path is closed between antenna node 848 and receiver node 838, and in which the transmit signal path is open between transmitter node 828 and antenna node 848.

In accordance with the embodiments described herein, the RF switch 810 includes at least one bias coupling circuit (e.g., one or more of bias coupling circuits 112, 212, 312, 314, 700, FIGS. 1-3, 6, 7) that is configured to selectively bias the output terminals of one or more switching transistors. Specifically, each bias coupling circuit couples one or more gate terminals in a first FET stack to one or more output terminals in a second FET stack. Again, such coupling of the gate terminals in the first FET stack to the output terminals of the second FET stack can provide a bias voltage to the transistors of the second FET stack that significantly reduces the effects of gate-lag while not significantly reducing the power handling capability of the transistor stack.

The RF transceiver system 800 may be physically implemented using a variety of active and passive electrical devices, which may be housed on one or more printed circuit boards (PCBs) and/or other substrates. To facilitate assembly of such a system, various components of the RF transceiver system 800 may be implemented in self-contained modules or electrical devices, which may be coupled to a PCB that electrically connects the module/devices to other portions of the RF transceiver system 800. As used herein, the term "module" means a set of active and/or passive electrical devices (e.g., ICs and components) that are physically contained within a single housing (e.g., the device(s) are included on a common substrate (referred to herein as a "module substrate") or within a single package. A "module" also includes a plurality of conductive terminals for electrically connecting the set of devices to external circuitry that forms other portions of an electrical system. Essentially, the module substrate configuration, the method of coupling the device(s) to the module's terminals, and the number of devices within the module defines the module type. For example, in various embodiments, a module may be in the form of a surface mount device, a chip carrier device, a ball, pin, or land grid array device, a flat package (e.g., a quad or dual flat package) device, a chip scale packaged device, a system-in-package (SiP) device, or in the form of some other type of integrated circuit package. Although a particular type of module is described below, it is to be understood that embodiments of the inventive subject matter may be included in other types of modules, as well.

Figure 9:
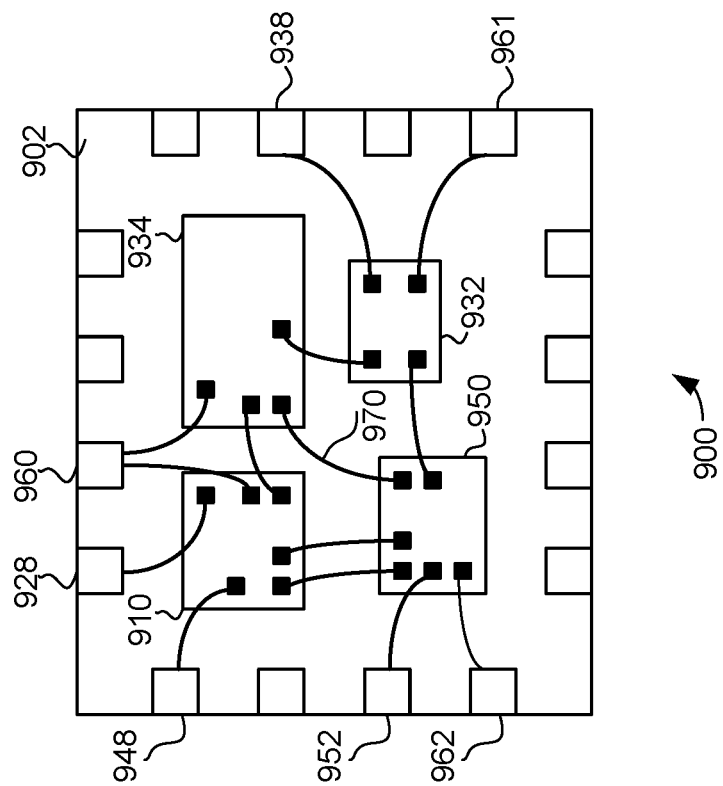
FIG. 9 is a top view of a module that embodies a portion of the RF transceiver system of FIG. 8, in accordance with an embodiment.

For example, turning to FIG. 9, a top view of a module 900 that embodies a portion of the RF transceiver system 800 of FIG. 8, in accordance with an embodiment is illustrated. Module 900 includes a module substrate 902, which may be a relatively small PCB, a conductive flange, or another rigid structure. Module 900 also includes a plurality of ICs coupled to the module substrate 902, including an RF switch integrated circuit (IC) 910 (e.g., an IC that embodies RF switch 100, 200, 300, 600, 810), a receive amplifier IC 932 (e.g., receive amplifier 832, FIG. 8), a receive matching circuit IC 934, and an RF switch controller IC 950. In addition, module 900 includes a transmit signal input terminal 928 (e.g., corresponding to transmitter node 828, FIG. 8), a receive signal output terminal 938 (e.g., corresponding to receiver node 838, FIG. 8), an antenna terminal 948 (e.g., corresponding to antenna terminal 848, FIG. 8), a transmit/receive (TX/RX) control signal terminal 952, one or more ground terminals 960, 961, and one or more power terminals 962. The various ICs 910, 932, 934, 950 and terminals 928, 938, 948, 952, 960-962 are electrically connected together through a plurality of wirebonds (e.g., wirebond 970). In other embodiments, various ones of the ICs 910, 932, 934, 950 and terminals 928, 938, 948, 952, 960-962 may be electrically connected together using other conductive structures (e.g., conductive traces on and within module substrate 902 and/or conductive vias through module substrate 902). In various embodiments, the module 900 may be housed in an air-cavity package or an overmolded (e.g., encapsulated) package, although the module 900 may be considered to be complete without such packaging, as well.

After incorporation of module 900 into a transceiver system (e.g., system 800, FIG. 8), and during operation of the transceiver system, power and ground reference voltages may be provided to module 900 through power and ground terminals 960-962. RF switch controller IC 950 may convert an input power voltage (e.g., +5.0 volts) received through power terminal 962. In addition, RF switch controller IC 950 may receive switch control signals (e.g., TTL level signals) through TX/RX control signal terminal 952. Based on the received switch control signals, the RF switch controller IC 950 provides switch control signals (e.g., the control and inverse control signals discussed above) to control terminals (e.g., gates) of various transistors (e.g., transistors within RF switches 100, 200, 300, 600) of the RF switch IC 910. As was described above, the switch control signals determine whether each of the various transistors is in a conducting or non-conducting state at any given time. More specifically, the switch control signals determine whether the RF switch IC 910 is in a transmit state (i.e., a state in which the switch is configured to convey an RF signal from the transmitter to the antenna) or a receive state (i.e., a state in which the switch is configured to convey an RF signal from the antenna to the receiver) at any given time.

When the switch control signals configure the RF switch IC 910 in the transmit state, transmit signals received by the RF switch IC 910 from a power amplifier (e.g., power amplifier 824, FIG. 8) through the transmit signal input terminal 928 are passed through the RF switch IC 910 to the antenna terminal 948. Conversely, when the switch control signals place the RF switch IC 910 in the receive state, signals received from the antenna terminal 948 are passed through the RF switch IC 910 to the receive matching circuit IC 934. The receive matching circuit IC 934 may include one or more integrated passive devices (e.g., capacitors, inductors, and/or resistors). The integrated passive devices, along with inductances of the wirebonds 970 between the receive matching circuit IC 934, the RF switch IC 910, and the receive amplifier IC 932, compose an impedance matching circuit between the RF switch IC 910 and the receive amplifier IC 932. In an alternate embodiment, the receive matching circuit IC 934 may be replaced by discrete components. Either way, the impedance matching circuit also may perform filtering of receive signals that pass from the RF switch IC 910 to the receive amplifier IC 932 through the impedance matching circuit. The receive amplifier IC 932 receives the receive signals from the receive matching circuit IC 934 and amplifies the receive signals. The receive amplifier IC 932 then provides the amplified receive signals to receive signal output terminal 938.

Figure 10:
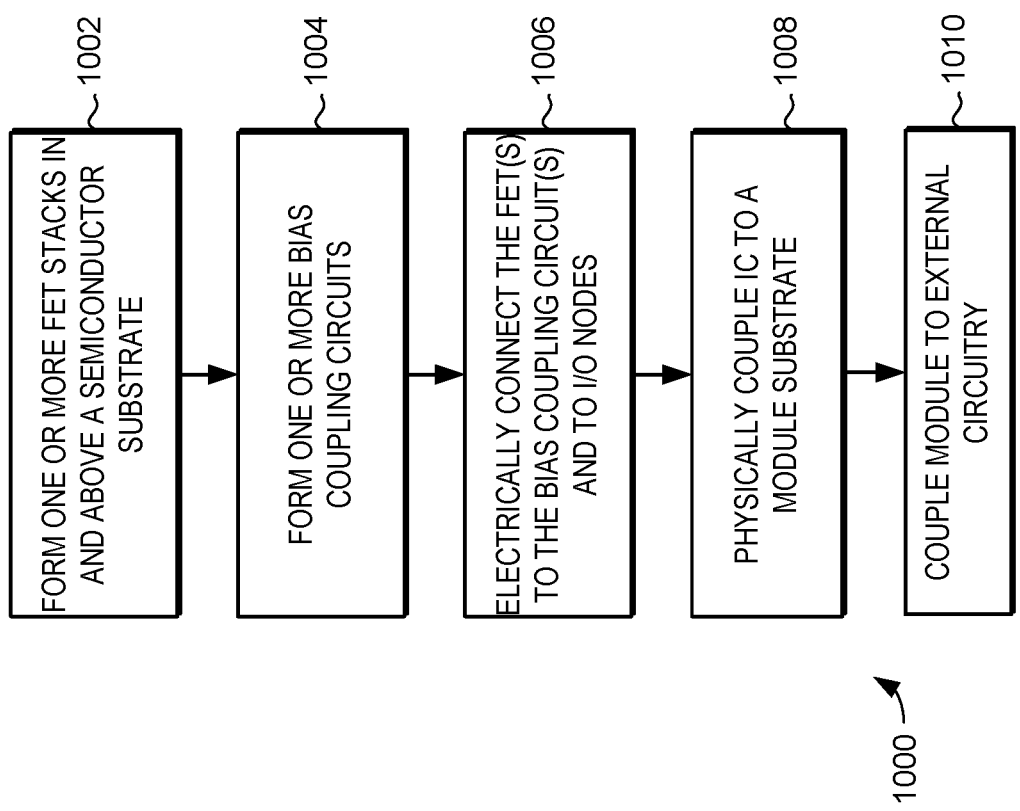
FIG. 10 is a flowchart of a method of fabricating an IC with one or more bias coupling circuits electrically coupled to one or more FETs, in accordance with an embodiment.

FIG. 10 is a flowchart of a method of fabricating an IC (e.g., RF switch IC 910, FIG. 9) with one or more FETs (e.g., FETs 362, 364, 366, 368 FIGS. 3 and 6) and one or bias coupling circuits (e.g., bias coupling circuits 112, 212, 312, 314, 700, FIGS. 1, 2, 3, 6, 7), in accordance with various embodiments. In a typical IC fabrication process, multiple ICs are fabricated in parallel on a semiconductor wafer, and one of the final fabrication steps includes singulating the individual ICs from the wafer. For simplicity of description, fabrication of a single IC is described below. Those of skill in the art would understand, based on the description herein, that a plurality of ICs may be fabricated simultaneously, as indicated above. Although not specifically pointed out below, when wafer fabrication processes are employed, an IC singulation process may be performed, for example, after block 1004. Similarly, a typical module fabrication process (or IC packaging process) may include simultaneously forming a plurality of modules on a leadframe or PCB, and subsequently singulating each module from the leadframe or PCB. Although also not specifically pointed out below, a module singulation process may be performed, for example, after block 1008.

To facilitate understanding, the below-described method will make reference to fabricating RF switch 300 (FIG. 3) with one or more voltage leveling circuits (e.g., circuits 312, 314, FIG. 3, FIG. 6). However, those of skill in the art would understand, based on the description herein, that the fabrication embodiments alternatively may be used to fabricate differently configured RF switch ICs or other types of devices altogether. Accordingly, reference to the above-described RF switch IC embodiments should not be construed to limit the scope of the inventive subject matter only to those embodiments.

The method may begin, in block 1002, by forming one or more FETs (e.g., FETs 362, 364, 366, 368, FIG. 3) in and above a semiconductor substrate. In some embodiments, multiple FETs may be formed and electrically interconnected as FET stacks. Generally, each FET includes a gate terminal and output terminals (e.g., source and drain terminals).

As discussed above, the semiconductor substrate may include any of a variety of different semiconductor substrate materials (e.g., GaAs, GaN, GaN on Si, GaN on SiC, Si, SoI, bulk Si, and so on), and the FET(s) may have any of a variety of different structures (e.g., pHEMT, MOSFET, HEMT, MESFET, LDMOS FET, EMOSFET, JFET, and so on). According to an embodiment, prior to forming the FETs, conductive through substrate vias (TSVs) may be formed partially or entirely through the substrate to provide for electrical conductivity between the top and bottom surfaces of the substrate (e.g., between a current conducting terminal of one or more of the FETs and a ground reference node at the bottom of the substrate).

In block 1004, the method may continue by forming one or more bias coupling circuits (e.g., bias coupling circuits 112, 212, 312, 314, 700, FIGS. 1, 2, 3, 6, 7) over the semiconductor substrate. As discussed previously, in various embodiments, the bias coupling circuits include one or more impedance elements (e.g., resistors 702, 704, 706, FIG. 7) and various electrical connections between the gate terminals and output terminals of the FETs. The impedance elements be integrally-formed passive components (e.g., integrally formed capacitors, resistors, and/or inductors), and/or discrete components (e.g., discrete capacitors, resistors, and/or inductors), in various embodiments.

In block 1006, the method may continue by electrically coupling the terminals of FETs to the bias coupling circuits and to various I/O nodes (e.g., nodes 102, 104, 106, 228, 238, 248, 252, 253, 328, 338, 348, 352, 353, FIGS. 1, 2, 3, 6). For example, the electrical connections between the FETs and the bias coupling circuits may include integrated electrical connections. Ultimately, during operation, electrical signals may be received through the nodes from external circuitry, and so electrical signals processed through the FET(s) may be provided through the nodes to external circuitry. For example, as discussed previously, the nodes may include a first I/O node, a second I/O node, ground reference nodes, and an antenna node.

In block 1008, the IC (e.g., RF switch IC 910) is physically coupled to a module substrate (e.g., to module substrate 902, FIG. 9). In addition, one or more additional ICs and/or components also may be physically coupled to the module substrate.

In block 1010, the IC(s) and components are electrically coupled to each other, and to terminals that are configured to convey signals, power, and ground references between external circuitry and the IC(s)/components of the module. The module substrate configuration, the method of coupling the IC(s) and components to the module's terminals, and the number of ICs within the module defines the module or package type. The module may then be completed (e.g., by encapsulating the module or containing the module in an air cavity package). Once the module is completed, it may be physically and electrically coupled to external circuitry (e.g., other portions of system 800, FIG. 8).

In one embodiment and RF switch is provided, comprising: a first input/output (I/O) node; a second I/O node; a first field effect transistor (FET) coupled between the antenna node and the first I/O node, the first FET having a first gate terminal; a first FET stack coupled between the antenna node and the second I/O node, the first FET stack having a first plurality of output terminals; and a first bias coupling circuit electrically coupling the first gate terminal to one or more output terminals of the first plurality of output terminals.

In another embodiment and RF switch is provided, comprising: an antenna node; a first input/output (I/O) node; a second I/O node; a first field effect transistor (FET) stack coupled between the antenna node and the first I/O node, the first FET stack having a first gate terminal and a first plurality of output terminals; a second FET stack coupled between the antenna node and the second I/O node, the second FET stack having a second gate terminal and a second plurality of output terminals; and a first bias coupling circuit electrically coupling the first gate terminal to the second plurality of output terminals.

In another embodiment and RF switch is provided, comprising: an antenna node; a transmit node; a receive node; a first reference node; a second reference node; a first field effect transistor (FET) stack coupled between the antenna node and the transmit node, the first FET stack including a first series coupled plurality of FETs, each of the first series coupled plurality of FETs having a first plurality of output terminals, the first FET stack having a first gate terminal; a second FET stack coupled between the antenna node and the receive node, the second FET stack including a second series coupled plurality of FETs, each of the second series coupled plurality of FETs having a second plurality of output terminals, the second FET stack having a second gate terminal; a third FET stack coupled between the transmit node and the first reference node, the third FET stack including a third series coupled plurality of FETs, each of the third series coupled plurality of FETs having a third plurality of output terminals, the third FET stack having a third gate terminal; a fourth FET stack coupled between the receive node and the second reference node, the fourth FET stack including a fourth series coupled plurality of FETs, each of the fourth series coupled plurality of FETs having a fourth plurality of output terminals, the fourth FET stack having a fourth gate terminal; a first bias coupling circuit electrically coupling the first gate terminal to the second plurality of output terminals; and a second bias coupling circuit electrically coupling the first gate terminal to the third plurality of output terminals.

In another embodiment a method of controlling a radio frequency (RF) switch that includes a first field effect transistor (FET) stack between an antenna node and first I/O node, and a second FET stack between the antenna node and a second I/O node, is provided, the method comprising the steps of: providing a first control signal at a gate terminal of a FET in the first FET stack to at least one output terminal of at least one FET in the second FET stack; and simultaneously with the providing of the first control signal, providing a second control signal that is an inverse of the first control signal to a gate terminal of the FET in the second FET stack.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the foregoing technical field, background, or detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) switch comprising:
   an antenna node;
   a first input/output (I/O) node;
   a second I/O node;
   a first field effect transistor (FET) coupled between the antenna node and the first I/O node, the first FET having a first gate terminal;
   a first FET stack coupled between the antenna node and the second I/O node, the first FET stack having a first plurality of output terminals; and
   a first bias coupling circuit electrically coupling the first gate terminal to one or more output terminals of the first plurality of output terminals, wherein the first bias coupling circuit is configured to provide a control signal at the first gate terminal to the one or more output terminals of the first plurality of output terminals.

2. The RF switch of claim 1, wherein the first bias coupling circuit comprises a first plurality of impedance elements, each of the first plurality of impedance elements coupled to one of the first plurality of output terminals.

3. The RF switch of claim 1, wherein the first bias coupling circuit comprises a first plurality of resistors, each of the first plurality of resistors electrically coupled to one of the first plurality of output terminals.

4. The RF switch of claim 3, wherein the each of the first plurality of resistors has a resistance of greater than 10K ohms.

5. A radio frequency (RF) switch comprising:
   an antenna node;
   a first input/output (I/O) node;
   a second I/O node;
   a first field effect transistor (FET) coupled between the antenna node and the first I/O node, the first FET having a first gate terminal;
   a first FET stack coupled between the antenna node and the second I/O node, the first FET stack having a first plurality of output terminals;
   a first bias coupling circuit electrically coupling the first gate terminal to one or more output terminals of the first plurality of output terminals;
   a second FET stack coupled between the first I/O node and a first reference node, the second FET stack having a second plurality of output terminals; and
   a second bias coupling circuit electrically coupling the first gate terminal to the second plurality of output terminals.

6. The RF switch of claim 5, wherein the second bias coupling circuit comprises a second plurality of resistors, each of the second plurality of resistors electrically coupled to one of the second plurality of output terminals.

7. The RF switch of claim 1, wherein each of the first FET and the first FET stack are formed on a gallium arsenide (GaAs)-based substrate or a gallium nitride (GaN)-based substrate.

8. The RF switch of claim 1, wherein each of the first plurality of output terminals comprise a source terminal or a drain terminal.

9. A radio frequency (RF) switch comprising:
   an antenna node;
   a transmit node;
   a receive node;

a first reference node;
a second reference node;
a first field effect transistor (FET) stack coupled between the antenna node and the transmit node, the first FET stack including a first series coupled plurality of FETs, each of the first series coupled plurality of FETs having a first plurality of output terminals, the first FET stack having a first gate terminal;
a second FET stack coupled between the antenna node and the receive node, the second FET stack including a second series coupled plurality of FETs, each of the second series coupled plurality of FETs having a second plurality of output terminals, the second FET stack having a second gate terminal;
a third FET stack coupled between the transmit node and the first reference node, the third FET stack including a third series coupled plurality of FETs, each of the third series coupled plurality of FETs having a third plurality of output terminals, the third FET stack having a third gate terminal;
a fourth FET stack coupled between the receive node and the second reference node, the fourth FET stack including a fourth series coupled plurality of FETs, each of the fourth series coupled plurality of FETs having a fourth plurality of output terminals, the fourth FET stack having a fourth gate terminal;
a first bias coupling circuit electrically coupling the first gate terminal to the second plurality of output terminals; and
a second bias coupling circuit electrically coupling the first gate terminal to the third plurality of output terminals.

10. The RF switch of claim 9, wherein:
the first bias coupling circuit comprises a first plurality of resistors, each of the first plurality of resistors coupled to one of the second plurality of output terminals, and
the second bias coupling circuit comprises a second plurality of resistors, each of the second plurality of resistors electrically coupled to one of the third plurality of output terminals.

11. The RF switch of claim 10, wherein each of the first plurality of resistors and the second plurality of resistors has a resistance greater than 10K ohms.

12. The RF switch of claim 9, wherein each of the first FET stack, the second FET stack, the third FET stack, and the fourth FET stack are formed on a gallium arsenide (GaAs)-based substrate or a gallium nitride (GaN)-based substrate.

13. A method of controlling a radio frequency (RF) switch that includes a first field effect transistor (FET) stack between an antenna node and first I/O node, and a second FET stack between the antenna node and a second I/O node, the method comprising the steps of:
providing a first control signal at a gate terminal of a FET in the first FET stack to at least one output terminal of at least one FET in the second FET stack; and
simultaneously with the providing of the first control signal, providing a second control signal that is an inverse of the first control signal to a gate terminal of the FET in the second FET stack.

14. The method of claim 13, wherein the providing of the first control signal to the at least one output terminal of the at least one FET in the second FET stack comprises providing the first control signal through at least one impedance element coupled to the at least one output terminal.

15. The method of claim 13, wherein the providing of the first control signal to the at least one output terminal of the at least one FET in the second FET stack comprises providing the first control signal through at least one resistor coupled to the at least one output terminal.

16. The method of claim 15, wherein the each of the at least one resistor has a resistance greater than 10K ohms.

17. The method of claim 13, wherein each of the first FET and the second FET stack are formed on a gallium arsenide (GaAs)-based substrate or a gallium nitride (GaN)-based substrate.

18. A method of controlling a radio frequency (RF) switch that includes a first field effect transistor (FET) stack between an antenna node and first I/O node, a second FET stack between the antenna node and a second I/O node, and a third FET stack between the first I/O node and a first reference node, the method comprising the steps of:
providing a first control signal at a gate terminal of a FET in the first FET stack to at least one output terminal of at least one FET in the second FET stack;
simultaneously with the providing of the first control signal, providing a second control signal that is an inverse of the first control signal to a gate terminal of the FET in the second FET stack; and
providing the first control signal at the gate terminal of the FET in the first FET stack to at least one output terminal of at least one FET in the third FET stack.

19. The method of claim 18, wherein the providing of the first control signal to the at least one output terminal of the at least one FET in the third FET stack comprises providing the first control signal through at least one impedance element coupled to the at least one output terminal.

20. The method of claim 18, wherein the providing of the first control signal to the at least one output terminal of the at least one FET in the third FET stack comprises providing the first control signal through at least one resistor coupled to the at least one output terminal.

* * * * *